US008030205B2

(12) United States Patent
Lee et al.

(10) Patent No.: US 8,030,205 B2
(45) Date of Patent: Oct. 4, 2011

(54) METHOD FOR FABRICATING SEMICONDUCTOR DEVICE WITH METAL LINE

(75) Inventors: Hae-Jung Lee, Ichon-shi (KR); Sang-Hoon Cho, Ichon-shi (KR); Suk-Ki Kim, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/618,523

(22) Filed: Nov. 13, 2009

(65) Prior Publication Data

US 2010/0062598 A1 Mar. 11, 2010

Related U.S. Application Data

(63) Continuation of application No. 11/321,533, filed on Dec. 30, 2005, now Pat. No. 7,648,909.

(30) Foreign Application Priority Data

Apr. 30, 2005 (KR) ........................ 10-2005-0036591

(51) Int. Cl.
*H01L 21/4763* (2006.01)

(52) U.S. Cl. . 438/627; 438/640; 438/643; 257/E21.577; 257/E21.584

(58) Field of Classification Search ........................ None
See application file for complete search history.

(56) References Cited

U.S. PATENT DOCUMENTS

| | | | | |
|---|---|---|---|---|
| 5,933,756 | A * | 8/1999 | Fuse | 438/640 |
| 6,010,966 | A * | 1/2000 | Ionov | 438/706 |
| 6,020,271 | A * | 2/2000 | Yanagida | 438/720 |
| 6,654,233 | B2 * | 11/2003 | Tseng et al. | 361/679.27 |
| 6,794,304 | B1 * | 9/2004 | Gu et al. | 438/740 |

FOREIGN PATENT DOCUMENTS

JP 2003303882 A * 10/2003

OTHER PUBLICATIONS

Bestwick et al. "Tungsten etching mechanisms in CF4/O2 reactive ion etching plasmas" J. Appl. Phys. 66 (10), Nov. 15, 1989.*

* cited by examiner

*Primary Examiner* — Ha Tran T Nguyen
*Assistant Examiner* — Shaka Scarlett
(74) *Attorney, Agent, or Firm* — IP & T Group LLP

(57) ABSTRACT

A method for fabricating a semiconductor device includes forming an inter-layer insulation layer on a substrate; forming openings in the inter-layer insulation layer; forming a metal barrier layer in the openings and on the inter-layer insulation layer; forming a first conductive layer on the metal barrier layer and filled in the openings; etching the first conductive layer to form interconnection layers in the openings and to expose portions of the metal barrier layer, the interconnection layers being inside the openings and at a depth from a top of the openings; etching the exposed portions of the metal barrier layer to obtain a sloped profile of the metal barrier layer at top lateral portions of the openings; forming a second conductive layer over the inter-layer insulation layer, the interconnection layers and the metal barrier layer with the sloped profile; and patterning the second conductive layer to form metal lines.

18 Claims, 7 Drawing Sheets

METHOD FOR FABRICATING SEMICONDUCTOR DEVICE WITH METAL LINE

RELATED APPLICATION

This application is a continuation of U.S. patent application Ser. No. 11/321,533 filed on Dec. 30, 2005, now U.S. Pat. No. 7,648,909 which claims priority of Korean patent application number 10-2005-0036591 filed on Apr. 30, 2005. The disclosure of each of the foregoing applications is incorporated herein by reference in its entirety.

TECHNICAL FIELD

The present invention relates to a method for fabricating a semiconductor device; and, more particularly, to a method for fabricating a semiconductor device with a metal line.

DESCRIPTION OF RELATED ARTS

As semiconductor devices are highly integrated, the design rule also decreases. An opening burial technique, which is essential for forming multi-layer interconnections, is needed to allow mass production of semiconductor devices with deep openings such as contact holes and via holes having sizes of a sub-half micron with a high level of reliability. An example of an opening burial technique is the tungsten plug process, because tungsten has a low resistivity.

FIGS. 1A to 1C are cross-sectional views illustrating a method for forming a metal line in a semiconductor device using a conventional tungsten plug process.

Referring to FIG. 1A, an inter-layer insulation layer 12 is formed on a substrate 11 and planarized thereafter. Substrate 11 comprises silicon and may include other elements such as gate structures and bit lines. Inter-layer insulation layer 12 is selectively etched to form contact holes 13 in which metal lines are to be formed. Contact holes 13 expose predetermined portions of substrate 11, such as source and drain regions. A metal barrier layer 14 is formed in contact holes 13 and on inter-layer insulation layer 12. Metal barrier layer 14 is formed of TiN or Ti/TiN. A tungsten layer 15 is formed on metal barrier layer 14 and fills contact holes 13.

Referring to FIG. 1B, a blanket dry etching process is performed on tungsten layer 15 using a fluorine based plasma in an inductively coupled plasma (ICP) etching apparatus, thereby forming tungsten plugs 15A in contact holes 13. For instance, $SF_6$ plasma may be used for etching tungsten layer 15. Tungsten layer 15 is over etched by the blanket dry etching process so that tungsten plugs 15A are completely isolated from each other. More specifically, tungsten layer 15 is etched such that the tungsten formed outside contact holes 13 and a portion of the tungsten in contact holes 13 are etched. As a result, tungsten plugs 15A are formed at a depth 'D' from the top of contact holes 13, as shown in FIG. 1B. By forming tungsten plugs 15A at a depth inside contact holes 13, an electric short between subsequently formed aluminum-based metal lines may be prevented. Reference numeral 15B denotes an indentation formed after the above over-etching process.

Referring to FIG. 10, a metal liner layer 16 and an aluminum layer 17 are sequentially formed on the resultant structure shown in FIG. 1B. Metal liner layer 16 is formed of Ti/TiN. Although not illustrated, a subsequent metal line process is performed on aluminum layer 17 to form metal lines. Because aluminum has a poor step-coverage and indentations 15B have a very steep and vertical profile, voids 'V' occur at indentations 15B of tungsten plugs 15A when the metal lines are formed from aluminum layer 17. Such voids 'V' may cause an electromigration event in the aluminum-based metal lines due to electric stress. Electromigration may further result in defects in the aluminum-based metal lines and tungsten plugs, and may deteriorate reliability of semiconductor devices. Such deterioration is worse when the semiconductor devices operate at high speed, because an electric stress level and an occurrence of the electric stress increase.

Such problems associated with tungsten plugs and aluminum-based metal lines also occur when other forms of interconnections including contact plugs and metal lines are formed.

SUMMARY

The present invention provides a method for fabricating a semiconductor device capable of improving device reliability by improving a step-coverage characteristic of a metal line formed on a bottom structure including an interconnection layer such as a contact plug.

Consistent with embodiments of the present invention, a method for fabricating a semiconductor device with a metal line includes forming an inter-layer insulation layer on a substrate; forming openings in the inter-layer insulation layer; forming a metal barrier layer in the openings and on the inter-layer insulation layer; forming a first conductive layer on the metal barrier layer and filled in the openings; performing a first etching process to etch the first conductive layer to form interconnection layers in the openings, wherein the interconnection layers are formed inside the openings and at a depth from a top of the openings; performing a second etching process on portions of the metal barrier layer exposed after the first etching process to obtain a sloped profile of the metal barrier layer at top lateral portions of the openings; forming a second conductive layer over the inter-layer insulation layer, the interconnection layers and the metal barrier layer with the sloped profile; and patterning the second conductive layer to form metal lines.

Also consistent with embodiments of the present invention, a method for fabricating a semiconductor device includes forming an inter-layer insulation layer on a substrate; forming openings in the inter-layer insulation layer; forming a titanium nitride (TiN) layer on the inter-layer insulation layer and in the openings; forming a tungsten layer on the TiN layer and filled in the openings; performing a first etching process to etch the tungsten layer to form tungsten plugs in the openings, wherein the tungsten plugs are formed completely inside the openings and at a depth from a top of the openings; performing a second etching process on portions of the TiN layer exposed after the first etching process to obtain a sloped profile of the TiN layer at top lateral portions of the openings; forming an aluminum layer on the inter-layer insulation layer, the tungsten plugs, and the TiN layer with the sloped profile; and patterning the aluminum layer to form metal lines.

BRIEF DESCRIPTION OF THE DRAWINGS

The above and other features of the present invention will become better understood with respect to the following description of embodiments given in conjunction with the accompanying drawings, in which.

DETAILED DESCRIPTION OF THE EMBODIMENTS

Methods for fabricating a semiconductor device with a metal line consistent with embodiments of the present invention will be described in detail with reference to the accompanying drawings.

FIGS. 2A to 2E are cross-sectional views illustrating a method for fabricating a semiconductor device with metal lines consistent with embodiments of the present invention.

Figure 1A:
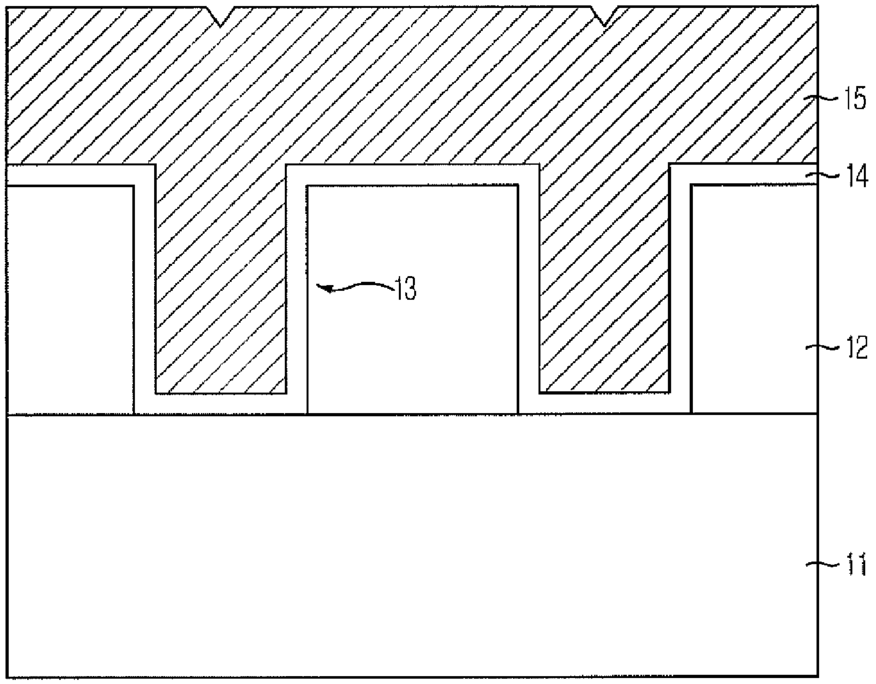
FIGS. 1A to 1C are cross-sectional views illustrating a method for a semiconductor device with metal lines using a conventional tungsten plug process.
Figure 1B:
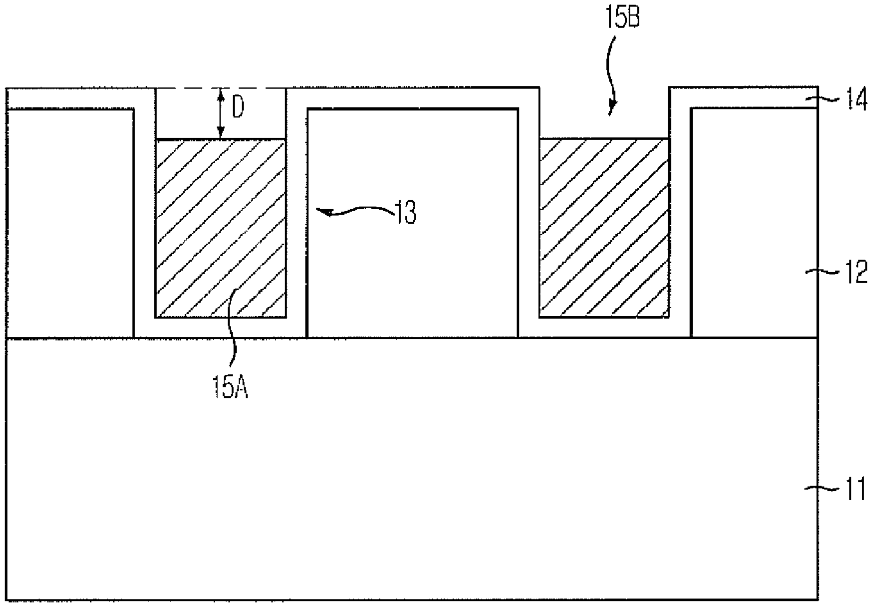
Figure 1C:
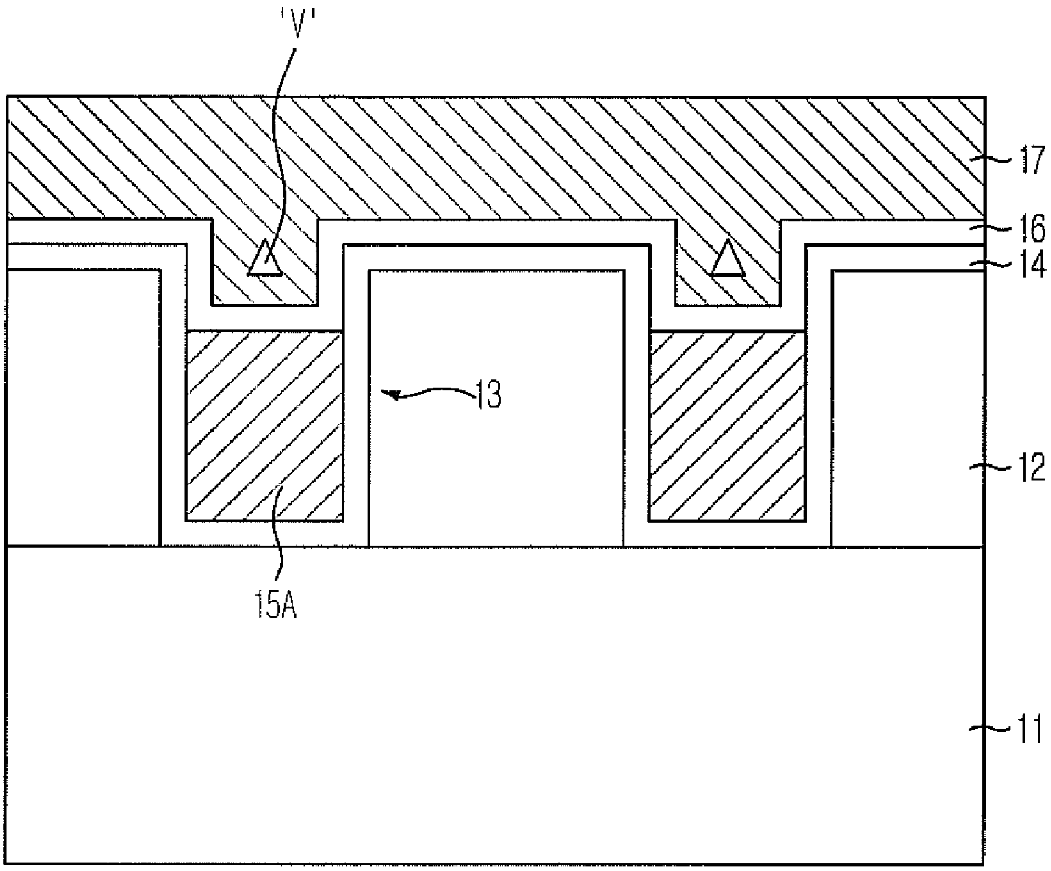
Figure 2A:
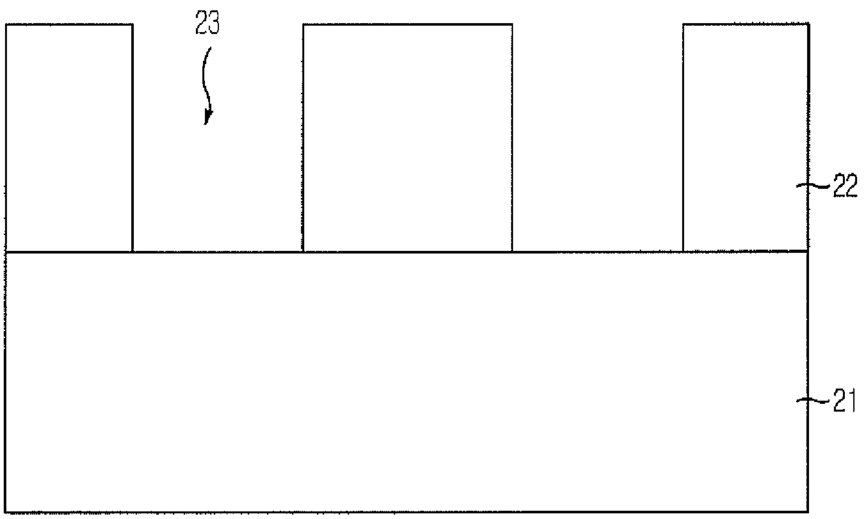
FIGS. 2A to 2E are cross-sectional views illustrating a method for fabricating a semiconductor device with metal lines consistent with embodiments of the present invention.

Referring to FIG. 2A, an inter-layer insulation layer 22 is formed on a substrate 21. Substrate 21 comprises silicon and may include previously formed elements such as gate structures and bit lines. Inter-layer insulation layer 22 is patterned using a photolithography process and a dry etching process to thereby form openings 23 exposing predetermined portions of substrate 21, e.g., source and drain regions. Openings 23 can be contact holes or via holes. Contact holes will be filled with conductive material for providing connections between a substrate and a metal line, between a bit line and a substrate, or between a substrate and a storage node. Via holes will be filled with conductive material for providing connections between metal lines. The conductive material filled into a via hole may be referred to as a via.

A cleaning process is performed to remove a native oxide layer or etch remnants remaining on the bottom surface of openings 23. The cleaning process is carried out by dipping the resulting structure shown in FIG. 2A into a solution of sulfuric acid ($H_2SO_4$) for approximately 5 minutes and then a diluted solution of fluoric acid (HF) for approximately 90 seconds. The HF solution is diluted in a diluting agent at a ratio of approximately 200 parts of the diluting agent to approximately 1 part of HF.

Figure 2B:
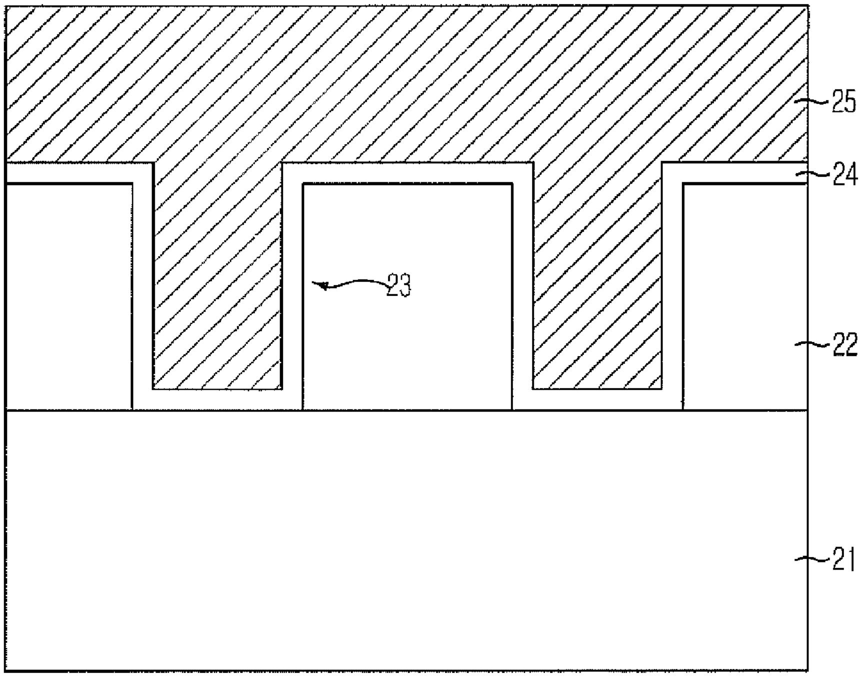

Referring to FIG. 2B, a metal barrier layer 24 is formed in openings 23 and on inter-layer insulation layer 22. Metal barrier layer 24 includes Ti/TiN or TiN and has a thickness ranging from approximately 100 Å to approximately 200 Å. A first conductive layer 25 is formed on metal barrier layer 24 and filled in openings 23. First conductive layer 25 comprises tungsten.

Figure 2C:
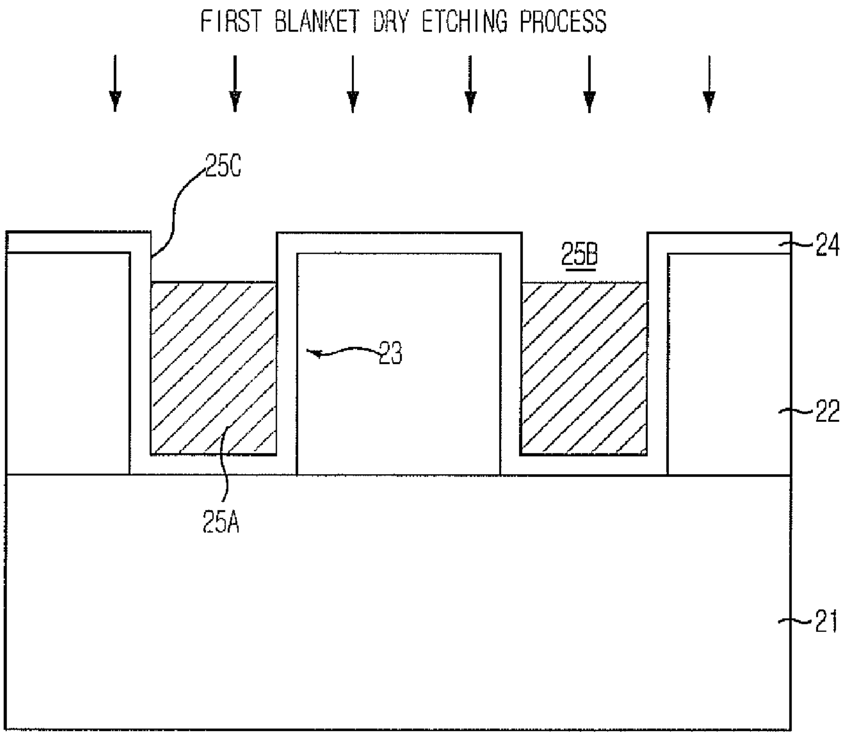

Referring to FIG. 2C, first conductive layer 25 is etched to form interconnection layers 25A in openings 23. Interconnection layers 25A can be contacts, contact plugs, plugs, or vias. To form interconnection layers 25A, a portion of first conductive layer 25 disposed outside the openings 23 is etched using a blanket dry etching process. Hereinafter, this blanket dry etching process is referred to as "first blanket dry etching process."

If first conductive layer 25 comprises tungsten, the first blanket dry etching process may be an etching using fluorine-based plasma in an inductively coupled plasma (ICP) etching apparatus. The fluorine-based plasma can be $SF_6$ plasma, which etches tungsten easily.

The first blanket dry etching over etches first conductive layer 25 so that interconnection layers 25A are isolated from each other. As a result of the over etching, first conductive layer 25 is etched to a depth in openings 23, and indentations 25B are formed. Indentations 25B have a sidewall 25C at nearly 90 degrees with respect to substrate 21. The reason for the over etch is that, if a portion of first conductive layer 25 remains outside the openings 23 after the first blanket dry etching, that portion of first conductive layer 25 may continue to exist even after a subsequent etching process for forming metal lines and may cause an electric short between the metal lines to be formed. For example, if first conductive layer 25 comprises tungsten and a second conductive layer for forming the metal lines comprises aluminum, and the second conductive layer is etched using $Cl_2$ plasma, the tungsten in the portion of first conductive layer 25 remaining after the first blanket dry etching still remains after the etching of the aluminum layer because tungsten has a low etching rate under $Cl_2$ plasma. As a result, the aluminum-based metal lines may be short connected by the remaining tungsten.

Figure 2D:
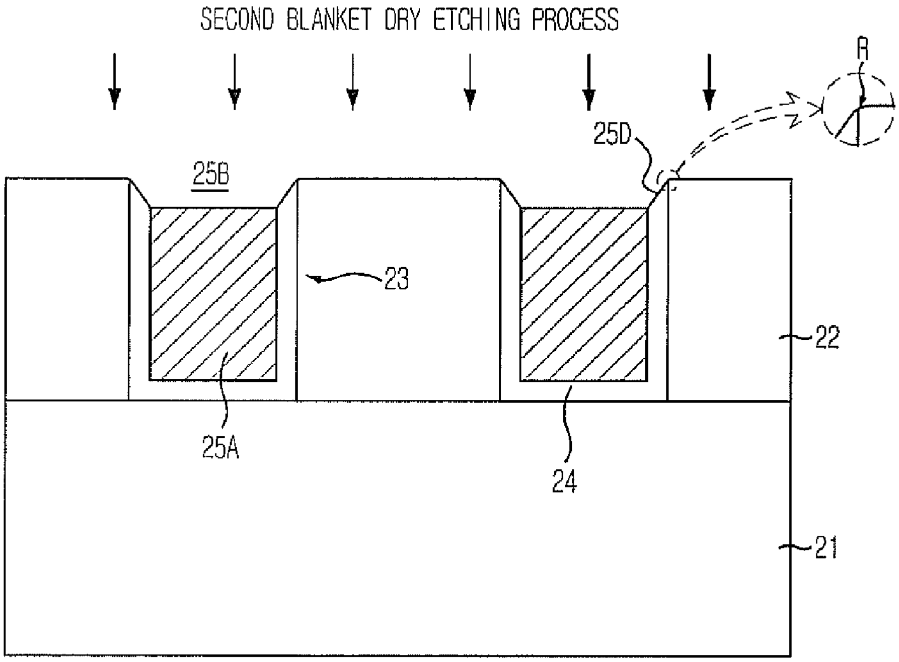

Then, with reference to FIG. 2D, an additional blanket dry etching process is performed in the same or different plasma etching apparatus where the first blanket dry etching process is performed. Hereinafter, this additional blanket dry etching process will be referred to as "second blanket dry etching process."

The second blanket dry etching process etches metal barrier layer 24 such that the top lateral portions of openings 23 have sloped profile 25D. A reference numeral 'R' refers to a rounded cusp of the sloped profile 25D, and the process of rounding the cusp will be described later. The second blanket dry etching process can be performed at various process conditions, which will be described in detail with reference to FIGS. 3 to 6.

Figure 2E:
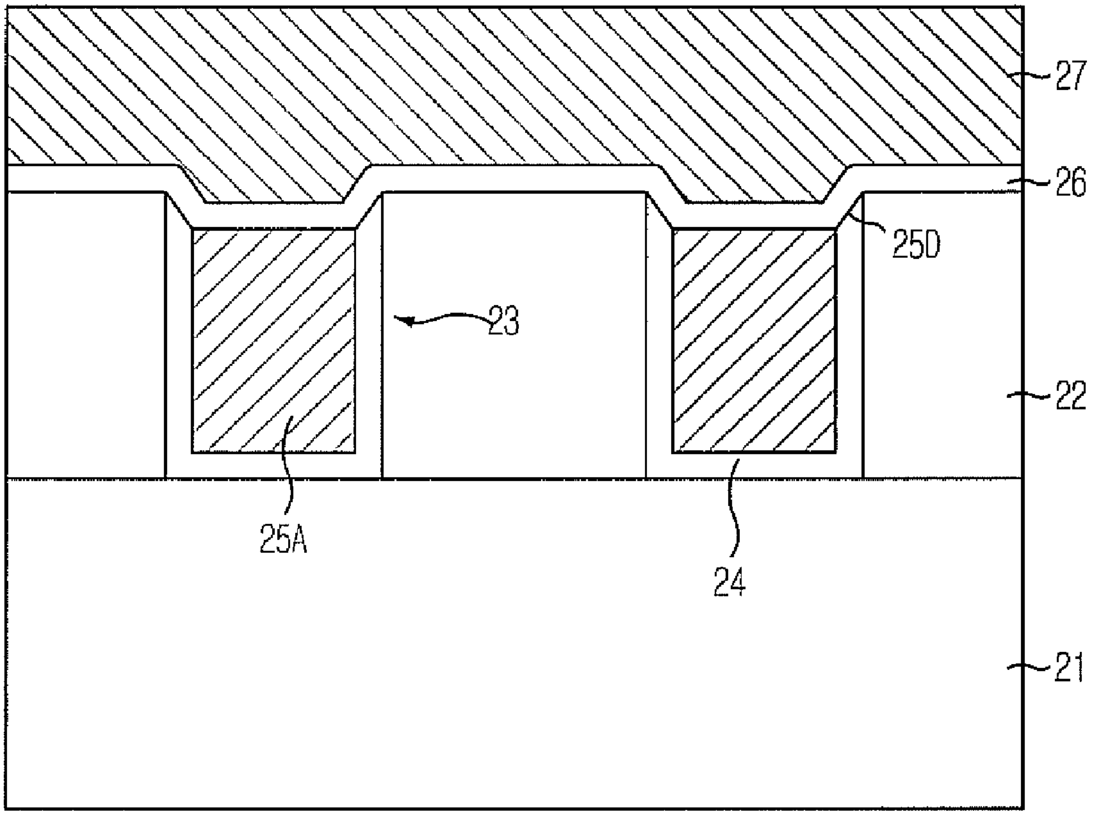

Referring to FIG. 2E, a metal liner layer 26 including TiN and Ti formed in sequential order is formed over the resulting structure shown in FIG. 2D, and a second conductive layer 27 is formed on metal liner layer 26. Because of sloped profile 25D of openings 23, second conductive layer 27 can be formed with an improved step-coverage and without voids. Although not illustrated, second conductive layer 27 is patterned to form metal lines. Second conductive layer 27 includes aluminum, and the etching of second conductive layer 27 uses $Cl_2$ plasma.

With reference to FIGS. 3 to 6, the second blanket dry etching process will be described in detail. Through FIGS. 3 to 6, reference numerals 44, 45, 45A, 45B, and 45D represent a metal barrier layer including TiN (hereinafter referred to as "TiN layer"), a first conductive layer including tungsten (hereinafter referred to as "tungsten layer"), an interconnection layer (hereinafter referred to as "tungsten plug"), an indentation of the tungsten plug 45A, and a sloped profile of the indentation 45B, respectively. The same reference numerals denoted in FIG. 2D are used for the same elements in FIGS. 3 to 6.

Also, it is assumed that the first blanket dry etching process and the second blanket dry etching process are performed in-situ in an ICP plasma etching apparatus using an ICP as a plasma source. The first blanket dry etching process and the second blanket dry etching process can also be performed ex-situ in different plasma etching apparatuses using different plasma sources.

Figure 3:
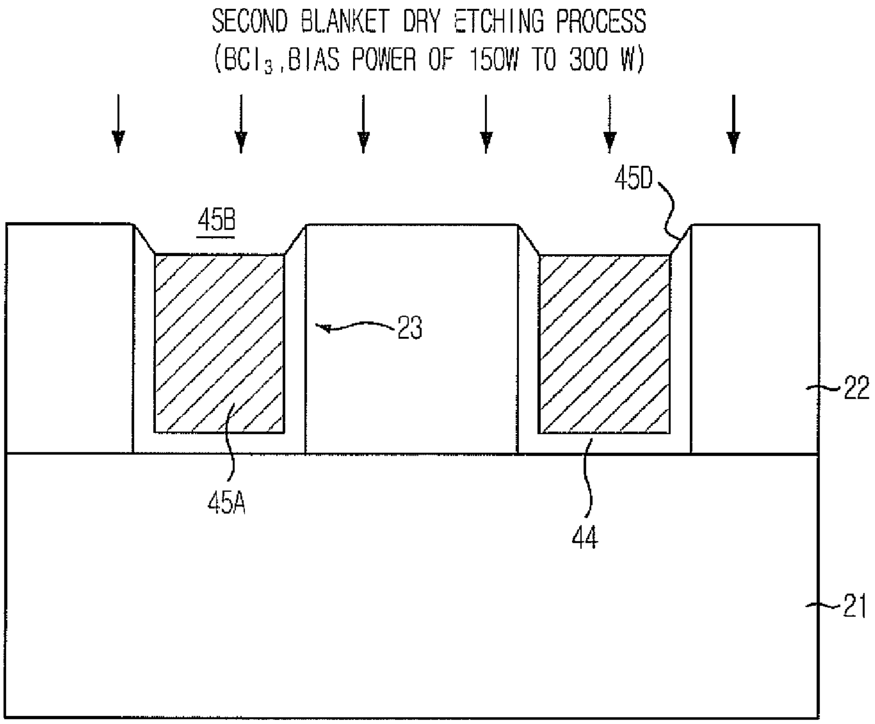
FIG. 3 is a cross-sectional view illustrating a blanket dry etching process consistent with a first embodiment of the present invention.

FIG. 3 is a diagram illustrating a blanket dry etching process as the second blanket dry etching process consistent with a first embodiment of the present invention.

The first blanket dry etching process is performed to etch tungsten layer 45 to form tungsten plugs 45A, and the second blanket dry etching process is performed to etch TiN layer 44 so that the edges of indentations 45B (i.e., the top lateral portions of openings 23) have a sloped profile 45D. As mentioned above, the first blanket dry etching process and the second blanket dry etching process can be performed in situ in the same ICP plasma etching apparatus. The first blanket dry etching process employs a fluorine-based gas as a main etch gas. The fluorine-based gas is selected from the group consisting of $SF_6$, $CF_4$ and $NF_3$. When the $CF_4$ gas is used, oxygen is additionally used. The second blanket dry etching process can be performed using boron trichloride ($BCl_3$) gas as a main etch gas and with a bias power of higher than approximately 150 W, e.g., in a range between 150 W and approximately 300 W. The $BCl_3$ gas flows in an amount of approximately 50 sccm to approximately 500 sccm.

The second blanket dry etching process etches TiN layer 44 and exposes tungsten plugs 45A. A portion of TiN layer 44 disposed outside openings 23 is removed using the $BCl_3$ gas. Also, a portion of TiN layer 44 on top lateral portions of openings 23 is etched to have sloped profile 45D.

The etching of TiN layer 44 by the second blanket dry etching process using the $BCl_3$ gas and the high bias power will be described in more detail hereinafter. As a reference, a dry etching process can be either a physical etching, or a chemical etching, or a physicochemical etching. A physical etching is a method of etching a target layer physically by implanting positive ions of a plasma, which is generated by employing an inert gas such as Ar, He or Xe, onto a wafer. A chemical etching is a method of etching a target layer chemically using activated neutral radicals of a plasma, which are generated by employing a gas that chemically reacts with the target layer in a plasma state. A physicochemical etching is a method of etching a target layer both physically and chemically using strong collision energy, which is generated by implanting positive ions of a plasma onto a wafer, and radicals, which chemically react with the target layer, at the same time. A physicochemical etching can increase an etch rate by approximately 1 Å per second as compared to either physical or chemical etching.

It is well known in the art that TiN can be chemically etched by $Cl_2$ gas and physically etched by boron ions. When $BCl_3$ gas is used to etch TiN, the chlorine included in $BCl_3$ may chemically etch TiN and the boron included in $BCl_3$ may physically etch TiN. Thus, the second blanket dry etching process, which uses $BCl_3$ as the main etch gas, consistent with the first embodiment, can etch TiN layer 44 both physically and chemically so that sloped profile 45D can be formed.

In more detail of the physicochemical etching of TiN layer 44, chlorine contained in the $BCl_3$ gas causes a chemical etching of TiN layer 44, whereas boron contained in the $BCl_3$ gas causes a physical etching of TiN layer 44. If the physical etching occurs using only boron, TiN layer 44 disposed outside openings 23 can be removed; however, TiN layer 44 disposed on the top lateral portions of openings 23 cannot be etched. Hence, sloped profile 45D cannot be obtained.

If the physical etching occurs using only chlorine, TiN layer 44 disposed on the top lateral portions of openings 23 can be isotropically etched to thereby obtain sloped profile 45D; however, TiN layer 44 disposed outside the openings 23 cannot be etched. Hence, an electric short event may occur due to remnants of TiN layer 44.

Therefore, the $BCl_3$ gas is used in the second blanket dry etching process to provide sloped profile 45D at the top lateral portions of openings 23 and simultaneously remove TiN outside openings 23. TiN layer 44 disposed outside the openings 23 is etched by both the physical etching and the chemical etching, and TiN layer 44 disposed on the top lateral portions of openings 23 is etched chemically.

Also, a bias power of higher than approximately 150 W, e.g., in a range between approximately 150 W to approximately 300 W, can increase the sputtering effect, which makes it easier to form sloped profile 45D at the top lateral portions of the openings 23.

The second blanket dry etching process exposes inter-layer insulation layer 22 and tungsten plugs 45A. However, inter-layer insulation layer 22 formed of an oxide and tungsten plugs 45A are not etched by the second blanket dry etching process due to the low etching rates of inter-layer insulation layer 22 and tungsten plugs 45A.

Due to the sputtering effect of the second blanket dry etching process, edge portions of inter-layer insulation layer exposed after the etching of TiN layer 44 at the top lateral portions of openings 23 may also be etched, and thus, a cusp of sloped profile 45D can be rounded. The rounding of the cusp of sloped profile 45D can improve the step coverage of a second conductive layer to be deposited later.

Figure 4:
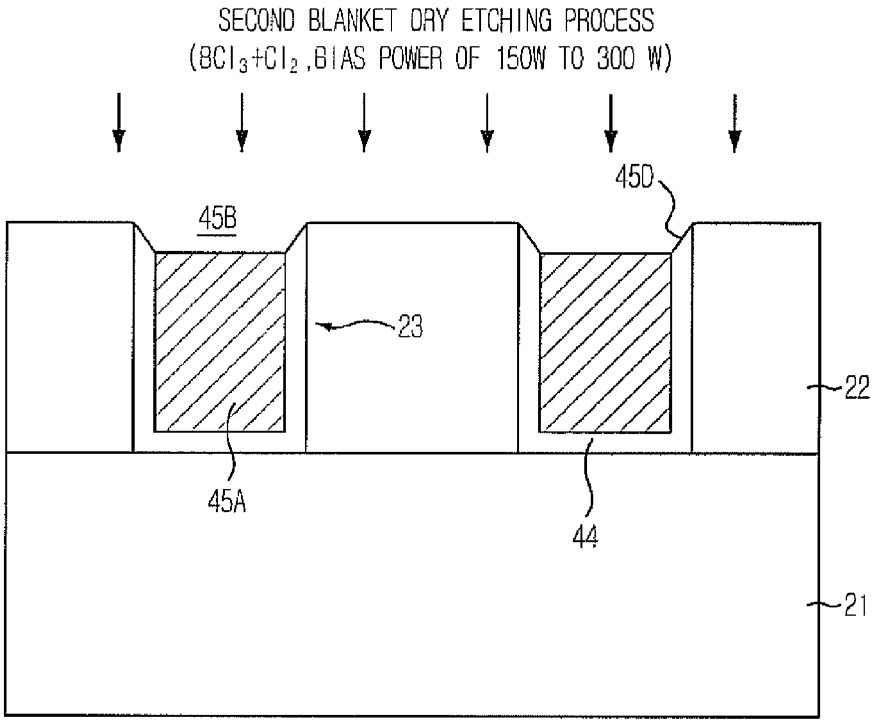
FIG. 4 is a cross-sectional view illustrating a blanket dry etching process consistent with a second embodiment of the present invention.

FIG. 4 is a diagram illustrating a blanket dry etching process as the second blanket dry etching process consistent with a second embodiment of the present invention.

The first blanket dry etching process is performed to etch tungsten layer 45 to form tungsten plugs 45A, and the second blanket dry etching process is performed to etch TiN layer 44 so that the edges of indentations 45B (i.e., the top lateral portions of openings 23) have a sloped profile 45D. As mentioned above, the first blanket dry etching process and the second blanket dry etching process can be performed in the ICP plasma etching apparatus. The first blanket dry etching process employs a fluorine-based gas as a main etch gas. The fluorine-based gas is selected from the group consisting of $SF_6$, $CF_4$ and $NF_3$. When the $CF_4$ gas is used, oxygen is additionally used. The second blanket dry etching process can be performed using $BCl_3$ gas as a main etch gas with a bias power of higher than approximately 150 W, e.g., in a range between 150 W and approximately 300 W. Consistent with the second embodiment, $Cl_2$ gas may be added to increase efficiency of the chemical etching. A flow of $BCl_3$ may be approximately 50 sccm to approximately 500 sccm, and a flow of $Cl_2$ may be approximately 5 sccm to approximately 50 sccm. In an aspect, the flow of $Cl_2$ is approximately one tenth the flow of $BCl_3$ to avoid a risk that the chemical etching is performed excessively on the sloped profile 45D. If the chemical etching is performed excessively, the depth of sloped profile 45D can increase beyond an intended level, causing an over-etching of TiN layer 44 disposed on the top lateral portions of openings 23.

The second blanket dry etching process etches TiN layer 44 and exposes tungsten plugs 45A. A portion of TiN layer 44 disposed outside contact holes 23 is removed using the $BCl_3$ gas and the $Cl_2$ gas. A portion of TiN layer 44 disposed on top lateral portions of openings 23 is also etched to have sloped profile 45D.

In the second blanket dry etching process, both the $Cl_2$ gas and the chlorine in the $BCl_3$ gas etch TiN layer 44 chemically and the boron in the $BCl_3$ gas etches TiN layer 44 physically. The addition of $Cl_2$ increases the chemical etching rate of TiN layer 44.

If the physical etching occurs using only boron, TiN layer 44 disposed outside openings 23 can be removed; however, TiN layer 44 disposed on the top lateral portions of the openings 23 cannot be etched. Hence, the sloped profile 45D cannot be obtained.

If the physical etching occurs using only chlorine, TiN layer 44 on the top lateral portions of openings 23 can be isotropically etched to form sloped profile 45D; however, TiN layer 44 disposed outside openings 23 cannot be etched. Hence, an electric short event may occur due to the remnants of TiN layer 44.

In the second blanket dry etching process consistent with the second embodiment, the $Cl_2$ gas is added to the $BCl_3$ gas to form sloped profile 45D at the top lateral portions of openings 23 and at the same time TiN outside openings 23 is removed. The $BCl_3$ gas causes the physicochemical etching of TiN layer 44, and the $Cl_2$ gas is added to increase an etching rate of the chemical etching of TiN layer 44. As a result, an etching time can be shortened, and the shortened etching time can further result in an elimination of an unnecessary over-exposure of the structure beneath TiN layer 44 during the second blanket dry etching process. Also, a bias power of higher than approximately 150 W, e.g., between approximately 150 W to approximately 300 W, can increase the sputtering effect to thereby form sloped profile 45D easily at the top lateral portions of openings 23.

The second blanket dry etching process using the $BCl_3$ gas and the $Cl_2$ gas exposes inter-layer insulation layer 22 and tungsten plugs 45A. However, inter-layer insulation layer 22 formed of an oxide and tungsten plugs 45A are not etched during the second blanket dry etching process due to the low etching rates of inter-layer insulation layer 22 and tungsten plugs 45A.

Due to the sputtering effect of the second blanket dry etching process, edge portions of inter-layer insulation layer 22 exposed after the etching of TiN layer 44 at the top lateral portions of openings 23 may also be etched, and thus, a cusp of sloped profile 45D can be rounded. The rounding of the cusp of sloped profile 45D can improve the step coverage of a second conductive layer to be deposited later.

Figure 5:
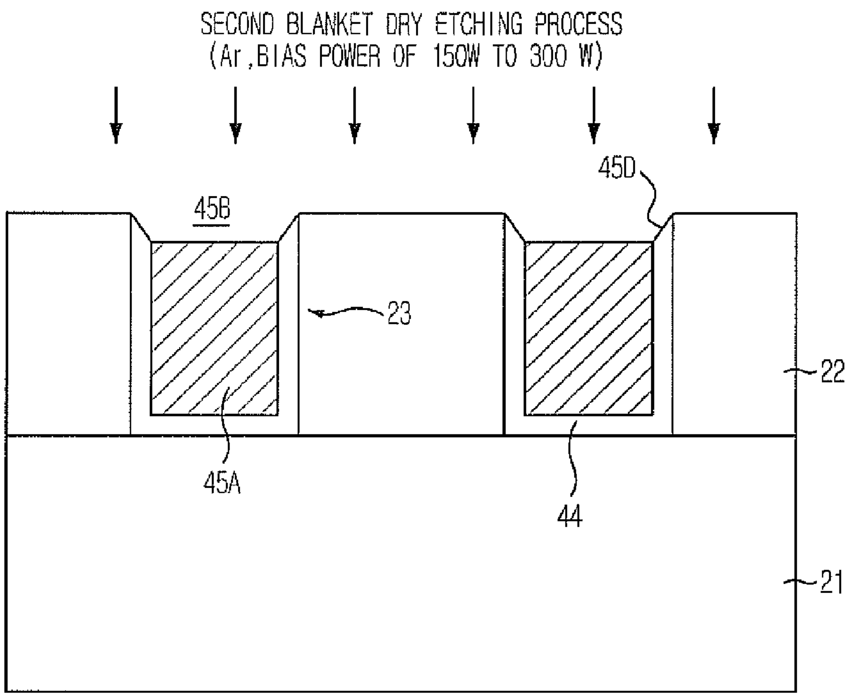
FIG. 5 is a cross-sectional view illustrating a blanket dry etching process consistent with a third embodiment of the present invention.

FIG. 5 is a diagram illustrating a blanket dry etching process as the second blanket dry etching process consistent with a third embodiment of the present invention.

The first blanket dry etching process is performed to etch tungsten layer 45 to form tungsten plugs 45A, and the second blanket dry etching process is performed to etch TiN layer 44 so that the edges of indentations 45B (i.e., the top lateral portions of openings 23) have a sloped profile 45D. As mentioned above, the first blanket dry etching process and the second blanket dry etching process can be performed in the ICP plasma etching apparatus. The first blanket dry etching process employs a fluorine-based gas as a main gas. The fluorine-based gas is selected from the group consisting of $SF_6$, $CF_4$ and $NF_3$. When the $CF_4$ gas is used, oxygen is additionally used. The second blanket dry etching process consistent with the third embodiment uses argon (Ar) gas as a main etch gas and is performed in the ICP etching apparatus. A bias power of higher than approximately 150 W, e.g., between 150 W and approximately 300 W, is supplied. A flow of the Ar gas is approximately 100 sccm to approximately 1,000 sccm.

The second blanket dry etching process etches TiN layer 44 and exposes tungsten plugs 45A. A portion of TiN layer 44 disposed outside contact holes 23 is removed using the Ar gas. A portion of TiN layer 44 disposed on top lateral portions of openings 23 is also etched to have sloped profile 45D.

Consistent with the third embodiment, plasma generated from the Ar gas, together with the high bias power, etches TiN layer 44 to form sloped profile 45D. Such an etching is a physical etching. The bias power of higher than approximately 150 W, e.g., between approximately 150 W to approximately 300 W, enhances the sputtering effect, which can make it easier to form sloped profile 45D. Hence, the second blanket dry etching process consistent with the third embodiment utilizes a reinforced physical etching of the Ar gas and the high bias power combined. As a reference, if the physical etching is carried out using only the Ar gas but without high bias power, TiN layer 44 disposed on the top lateral portions of openings 23 cannot be etched, and thus, it is difficult to obtain the sloped profile 45D.

Consistent with the third embodiment, the physical etching is carried out using the Ar gas as the main etch gas, coupled with the high bias power, so that sloped profile 45D is formed at the top lateral portions of openings 23. At the same time, the portion of TiN layer 44 disposed outside openings 23 is removed completely.

The second blanket dry etching process consistent with the third embodiment exposes inter-layer insulation layer 22 and tungsten plugs 45A. However, inter-layer insulation layer and tungsten plugs 45A are not etched due to the low etching rates of inter-layer insulation layer 22 and tungsten plugs 45A.

Due to the sputtering effect, edge portions of inter-layer insulation layer 22 exposed after the etching of TiN layer 44 at the top lateral portions of openings 23 may also be etched, and thus, a cusp of sloped profile 45D can be rounded. The rounding of the cusp of the sloped profile 45D can improve the step coverage of a second conductive layer to be deposited later.

Figure 6:
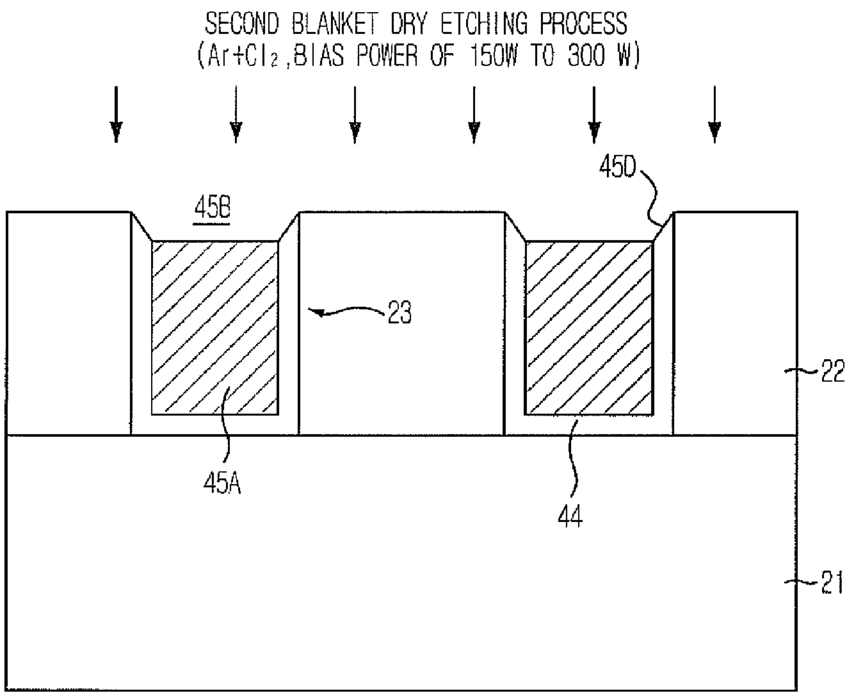
FIG. 6 is a cross-sectional view illustrating a blanket dry etching process consistent with a fourth embodiment of the present invention.

FIG. 6 is a diagram illustrating a blanket dry etching process as the second blanket dry etching process consistent with a fourth embodiment of the present invention.

The first blanket dry etching process is performed to etch tungsten layer 45 to form tungsten plugs 45A, and the second blanket dry etching process is performed to etch TiN layer 44 so that the edges of indentations 45B (i.e., the top lateral portions of openings 23) have a sloped profile 45D. As mentioned above, the first blanket dry etching process and the second blanket dry etching process can be performed in the ICP plasma etching apparatus. The first blanket dry etching process employs a fluorine-based gas as a main etch gas. The fluorine-based gas is selected from the group consisting of $SF_6$, $CF_4$ and $NF_3$. When the $CF_4$ gas is used, oxygen is additionally used. The second blanket dry etching process uses Ar gas as a main etch gas. Consistent with the fourth embodiment, $Cl_2$ gas is added to stimulate a chemical etching. A bias power of higher than approximately 150 W, e.g., between 150 W and approximately 300 W, is supplied. A flow of the Ar gas is approximately 100 sccm to approximately 1,000 sccm, and a flow of the $Cl_2$ gas is approximately 5 sccm to approximately 50 sccm. In an aspect, a flow of the $Cl_2$ gas is approximately one twentieth the flow of the Ar gas to avoid a risk that the chemical etching is performed excessively on sloped profile 45D. If the chemical etching is performed excessively, the depth of sloped profile 45D can increase beyond an intended level, causing an over-etching of TiN layer 44 disposed on the top lateral portions of openings 23. The addition of a small amount of the $Cl_2$ gas can increase the depth of sloped profile 45D, and reduce an overall etching time of the second blanket dry etching process.

The second blanket dry etching process consistent with the fourth embodiment uses the Ar gas and the $Cl_2$ gas to etch TiN layer 44 and to expose tungsten plugs 45A. A portion of TiN layer 44 disposed outside contact holes 23 and a portion of TiN layer 44 disposed on the top lateral portions of openings 23 are etched to have the sloped profile 45D.

Consistent the fourth embodiment, the second blanket dry etching process uses the gas mixture of the Ar gas and the $Cl_2$ gas so that TiN layer 44 can be etched chemically by the $Cl_2$ gas. The addition of the $Cl_2$ gas shortens the etching time of TiN layer 44.

Consistent with the fourth embodiment, the second blanket dry etching process physicochemically etch TiN layer 44 using the Ar gas as the main etch gas and the added $Cl_2$ gas. Particularly, to obtain the sloped profile 45D at the top lateral portions of openings 23 and to completely remove TiN layer 44 disposed outside openings 23, the second blanket dry etching process is performed such that TiN layer 44 disposed outside the openings 23 is etched physically and chemically with a high etch rate and TiN layer 44 disposed on the top lateral portions of openings 23 is etched chemically.

Also, the bias power of higher than approximately 150 W, e.g., between approximately 150 W to approximately 300 W, can enhance the sputtering effect to thereby obtain the sloped profile 45D easily at the top lateral portions of openings 23.

The second blanket dry etching process is performed using the Ar gas and the $Cl_2$ gas to expose inter-layer insulation layer 22 and tungsten plugs 45A. However, inter-layer insulation layer 22 formed of an oxide material and tungsten plugs 45A are not etched due to the low etching rates of inter-layer insulation layer 22 and tungsten plugs 45A.

Due to the sputtering effect, edge portions of inter-layer insulation layer 22 exposed after the etching of TiN layer 44 disposed on the top lateral portions of openings 23 may also be etched. Thus, a cusp of the sloped profile 45D can be rounded. The rounding of the cusp of the sloped profile 45D can improve the step coverage of a second conductive layer to be deposited later.

As discussed above, consistent with embodiments of the present invention, a step coverage of metal lines can be improved by forming sloped edges of indentations, which are formed on top of interconnection layers, on which the metal lines are to be formed. The improved step coverage can further improve the reliability of the semiconductor devices.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:

forming an inter-layer insulation layer on a substrate;

forming openings in the inter-layer insulation layer;

forming a metal barrier layer in the openings and on the inter-layer insulation layer;

forming a first conductive layer on the metal barrier layer and in the openings;

performing a first etching process to etch the first conductive layer to form interconnection layers in the openings, wherein the interconnection layers are formed inside the openings and at a depth from a top of the openings;

performing a second etching process on portions of the metal barrier layer exposed after the first etching process to obtain a sloped profile of the metal barrier layer at top lateral portions of the openings, wherein the second etching process removes the metal barrier layer throughout the top of the inter-layer insulation layer to expose the inter-layer insulation layer underneath and the sloped profile of the metal barrier layer has a rounded cusp;

forming a second conductive layer over the inter-layer insulation layer, the interconnection layers, and the metal barrier layer with the sloped profile; and patterning the second conductive layer to form metal lines, wherein the second etching process comprises a dry etching process using a main etch gas for physicochemically etching the metal barrier layer and an additional gas for chemically etching the metal barrier layer and, in the dry etching process, a flow of the additional gas is controlled to be approximately one tenth a flow of the main etch gas or approximately one twentieth the flow of the main etch gas.

2. The method of claim 1, wherein the first etching process and the second etching process comprise blanket dry etching processes in a plasma etching apparatus using an inductively coupled plasma (ICP) as a plasma source.

3. The method of claim 1, wherein the second etching process comprises etching at a bias power ranging from approximately 150 W to approximately 300 W.

4. The method of claim 1, wherein the openings are one of contact holes and via holes.

5. The method of claim 1, wherein forming the metal barrier layer includes forming the metal barrier layer from a material selected from titanium nitride, titanium, and a combination thereof.

6. The method of claim 5, wherein forming the first conductive layer comprises forming a layer of tungsten.

7. The method of claim 5, wherein forming the second conductive layer comprises forming a layer of aluminum.

8. The method of claim 1, wherein the first etching process and the second etching process are performed in-situ in an etching apparatus using the same plasma source.

9. The method of claim 1, wherein the first etching process and the second etching process are performed ex-situ in etching apparatuses using different plasma sources.

10. A method for fabricating a semiconductor device, comprising:

forming an inter-layer insulation layer on a substrate;

forming openings in the inter-layer insulation layer;

forming a titanium nitride (TiN) layer on the inter-layer insulation layer and in the openings;

forming a tungsten layer on the TiN layer and in the openings;

performing a first etching process to etch the tungsten layer to form tungsten plugs in the openings, wherein the tungsten plugs are formed inside the openings and at a depth from a top of the openings;

performing a second etching process on portions of the TiN layer exposed after the first etching process to obtain a sloped profile of the TiN layer at top lateral portions of the openings, wherein the second etching process removes the TiN layer throughout the top of the inter-layer insulation layer to expose the inter-layer insulation layer underneath and the sloped profile of the TiN layer has a rounded cusp;

forming an aluminum layer on the inter-layer insulation layer, the tungsten plugs, and the TiN layer with the sloped profile; and patterning the aluminum layer to form metal lines, wherein the second etching process comprises a dry etching process using a main etch gas for physicochemically etching the TiN layer and an additional gas for chemically etching the TiN layer and, in the dry etching process, a flow of the additional gas is controlled to be approximately one tenth a flow of the main etch gas or approximately one twentieth the flow of the main etch gas.

11. The method of claim 10, wherein the main etch gas comprises $BCl_3$, the additional gas comprises chlorine ($Cl_2$), and the bias power ranges from approximately 150 W to approximately 300 W.

12. The method of claim 11, wherein a flow of the $BCl_3$ gas ranges from 50 sccm to approximately 500 sccm and a flow of the $Cl_2$ gas correspondingly ranges from approximately 5 sccm to approximately 50 sccm.

13. The method of claim 10, wherein the TiN layer serves as a metal barrier layer.

14. The method of claim 10, wherein the first etching process uses a main etch gas selected from the group consisting of $CF_4$, $SF_6$ and $NF_3$.

15. The method of claim 10, wherein the first etching process uses the $CF_4$ gas as the main etch gas and oxygen gas as the additional gas.

16. The method of claim 15, wherein the first etching process and the second etching process comprise blanket dry etching processes in an etching apparatus using an inductively coupled plasma (ICP) as a plasma source.

17. The method of claim 16, wherein the first etching process and the second etching process are performed in-situ in an etching apparatus using an ICP as a plasma source.

18. The method of claim 15, wherein the first etching process and the second etching process are performed ex-situ at etching apparatuses using different plasma sources.

* * * * *